(12) United States Patent
Wang et al.

(10) Patent No.: US 12,421,603 B2
(45) Date of Patent: Sep. 23, 2025

(54) COMPOSITION FOR HIGH TEMPERATURE ATOMIC LAYER DEPOSITION OF HIGH QUALITY SILICON OXIDE THIN FILMS (71) Applicant: VERSUM MATERIALS US, LLC, Tempe, AZ (US)

(72) Inventors: Meiliang Wang, Tempe, AZ (US); Xinjian Lei, Vista, CA (US); Madhukar B. Rao, Carlsbad, CA (US)

(73) Assignee: Versum Materials US, LLC, Tempe, AZ (US)

( * ) Notice: Subject to any disclaimer, the term of this patent is extended or adjusted under 35 U.S.C. 154(b) by 800 days.

(21) Appl. No.: 17/282,604

(22) PCT Filed: Oct. 3, 2019

(86) PCT No.: PCT/US2019/054488
§ 371 (c)(1),
(2) Date: Apr. 2, 2021

(87) PCT Pub. No.: WO2020/072768
PCT Pub. Date: Apr. 9, 2020

(65) Prior Publication Data
US 2021/0363639 A1 Nov. 25, 2021

Related U.S. Application Data

(60) Provisional application No. 62/741,126, filed on Oct. 4, 2018.

(51) Int. Cl.
*C23C 16/40* (2006.01)
*C01B 33/113* (2006.01)
(Continued)

(52) U.S. Cl.
CPC ...... *C23C 16/45553* (2013.01); *C01B 33/113* (2013.01); *C23C 16/402* (2013.01);
(Continued)

(58) Field of Classification Search
CPC .................................. C23C 16/45553
See application file for complete search history.

(56) References Cited

U.S. PATENT DOCUMENTS 5,104,944 A * 4/1992 Goldberg ............. G03F 7/0387
528/332
2006/0043504 A1 3/2006 Ahn
(Continued)

FOREIGN PATENT DOCUMENTS

CN 103374708 A 10/2013
JP 2015129317 A 7/2015
(Continued)

*Primary Examiner* — Cachet I Proctor
(74) *Attorney, Agent, or Firm* — David K. Benson; Versum Materials US, LLC (57) ABSTRACT

Atomic layer deposition (ALD) process formation of silicon oxide with temperature >600° C. is disclosed. Silicon precursors used have a formula of: $1.R^1R^2_mSi(NR^3R^4)_n$ wherein $R^1$, $R^2$, and $R^3$ are each independently selected from a linear or branched $C_1$ to $C_{10}$ alkyl group, and a $C_6$ to $C_{10}$ aryl group; $R^4$ is selected from hydrogen, a linear or branched $C_1$ to $C_{10}$ alkyl group, and a $C_6$ to $C_{10}$ aryl group, a $C_3$ to $C_{10}$ alkylsilyl group; wherein $R^3$ and $R^4$ are linked to form a cyclic ring structure or $R^3$ and $R^4$ are not linked to form a cyclic ring structure; m is 0 to 2; n is 1 to 3; and m+n=3.

11 Claims, 2 Drawing Sheets

(51) Int. Cl.
*C23C 16/44* (2006.01)
*C23C 16/455* (2006.01)
*H01L 21/02* (2006.01)

(52) U.S. Cl.
CPC .... *C23C 16/4408* (2013.01); *H01L 21/02164* (2013.01); *H01L 21/02211* (2013.01); *H01L 21/0228* (2013.01); *C01P 2006/40* (2013.01)

(56) References Cited

U.S. PATENT DOCUMENTS

| | | | |
|---|---|---|---|
| 2008/0207007 A1* | 8/2008 | Thridandam | C23C 16/345 257/E21.24 |
| 2011/0074013 A1* | 3/2011 | Ueda | H01L 21/02274 423/325 |
| 2011/0077420 A1 | 3/2011 | Jung | |
| 2012/0148745 A1 | 6/2012 | Xiao et al. | |
| 2013/0295779 A1* | 11/2013 | Chandra | H01L 21/0228 546/14 |
| 2013/0319290 A1 | 12/2013 | Xiao et al. | |
| 2014/0179033 A1* | 6/2014 | Mathur | C23C 16/45525 438/17 |
| 2014/0287164 A1* | 9/2014 | Xiao | H01L 21/0228 546/14 |
| 2015/0275355 A1 | 10/2015 | Mallikarjunan et al. | |
| 2018/0127592 A1 | 5/2018 | Lei et al. | |
| 2018/0269057 A1 | 9/2018 | Lei et al. | |
| 2024/0093366 A1* | 3/2024 | Li | C23C 16/50 |

FOREIGN PATENT DOCUMENTS

| | | |
|---|---|---|
| KR | 10-2010-0106789 A | 10/2010 |
| KR | 10-2013-0116210 | 10/2013 |
| KR | 10-1759891 B1 | 7/2017 |

* cited by examiner

COMPOSITION FOR HIGH TEMPERATURE ATOMIC LAYER DEPOSITION OF HIGH QUALITY SILICON OXIDE THIN FILMS

CROSS-REFERENCE TO RELATED APPLICATIONS

This application claims priority to U.S. provisional patent application No. 62/741,126, filed on Oct. 4, 2018, the entirety of which is incorporated herein by reference.

BACKGROUND OF THE INVENTION

Described herein is a composition and method for the formation of a silicon oxide film. More specifically, described herein is a composition and method for formation of a silicon oxide film at one or more deposition temperatures of about 600° C. or greater and using an atomic layer deposition (ALD) process.

Thermal oxidation is a process commonly used to deposit high purity and highly conformal silicon oxide films such as silicon dioxide ($SiO_2$) in semiconductor applications. However, the thermal oxidation process has a very low deposition rate, e.g., less than 0.03 Å/s at 700° C. which makes it impractical for high volume manufacturing processes (see, for example, Wolf, S., "Silicon Processing for the VLSI Era Vol. 1—Process Technology", Lattice Press, C A, 1986).

Atomic Layer Deposition (ALD) and Plasma Enhanced Atomic Layer Deposition (PEALD) are processes used to deposit silicon dioxide ($SiO_2$) conformal film at low temperature (<500° C.). In both ALD and PEALD processes, the precursor and reactive gas (such as oxygen or ozone) are separately pulsed in certain number of cycles to form a monolayer of silicon dioxide ($SiO_2$) at each cycle. However, silicon dioxide ($SiO_2$) deposited at low temperatures using these processes may contain levels of impurities such as carbon (C), nitrogen (N), hydrogen (H) or combinations of such which are detrimental to semiconductor applications. To remedy this, one possible solution would be to increase deposition temperature such as 500° C. or greater. However, at these higher temperatures, conventional precursors employed by semi-conductor industries tend to self-react, thermally decompose, and deposit in chemical vapor deposition (CVD) mode rather than ALD mode. The CVD mode deposition has reduced conformality compared to ALD deposition, especially in high aspect ratio structure in semiconductor applications. In addition, the CVD mode deposition provides less control of film or material thickness than the ALD mode deposition.

JP2010275602 and JP2010225663 disclose the use of a raw material to form a Si containing thin film such as, silicon oxide by a CVD process at a temperature range of from 300-500° C. The raw material is an organic silicon compound, represented by formula: (a) $HSi(CH_3)(R^1)(NR^2R^3)$, wherein, $R^1$ represents $NR^4R^5$ or a 1C-5C alkyl group; $R^2$ and $R^4$ each represent a 1C-5C alkyl group or hydrogen atom; and $R^3$ and $R^5$ each represent a 1C-5C alkyl group); or (b) $HSiCl(NR^1R^2)(NR^3R^4)$, wherein $R^1$ and $R^3$ independently represent an alkyl group having 1 to 4 carbon atoms, or a hydrogen atom; and $R^2$ and $R^4$ independently represent an alkyl group having 1 to 4 carbon atoms. The organic silicon compounds include H—Si bonds U.S. Pat. No. 7,084,076 ("the '076 Patent") discloses a halogenated siloxane such as hexachlorodisiloxane (HCDSO) that is used in conjunction with pyridine as a catalyst for ALD deposition below 500° C. to form silicon dioxide.

U.S. Pat. No. 6,992,019 ("the '019 Patent") discloses a method for catalyst-assisted ALD to form a silicon dioxide layer having superior properties on a semiconductor substrate by using a first reactant component consisting of a silicon compound having at least two silicon atoms, or using a tertiary aliphatic amine as the catalyst component, or both in combination, together with related purging methods and sequencing. The precursor used is hexachlorodisilane. The deposition temperature is between 25-150° C.

U.S. Pat. Nos. 9,460,912 and 10,242,864 ("the '912 Patent and the '864") discloses composition(s) and atomic layer deposition (ALD) process(es) for the formation of a silicon oxide containing film at one or more deposition temperature of about 500 degrees centigrade is disclosed. In one aspect, the composition and process use one or more silicon precursors selected from compounds having the following formulae I, II, described and combinations thereof $R^1R^2{}_mSi(NR^3R^4)_nX_p$ I and $R^1R^2{}_mSi(OR^3)_n(OR^4)_qX_p$ II.

There is a need to develop a process for forming a high quality, low impurity, high conformal silicon oxide film using an ALD process or an ALD-like process, such as without limitation, a CVD process, to replace thermal-based deposition processes. Further, it is desirable to develop a high temperature deposition (e.g., deposition at one or more temperatures of 600° C.) to improve one or more film properties, such as purity and/or density, in an ALD or ALD-like process.

BRIEF SUMMARY OF THE INVENTION

Described herein is a process for the deposition of a silicon oxide material or film at high temperatures, e.g., at one or more temperatures of 600° C. or greater, in an ALD or an ALD-like process.

One embodiment, disclosed is a process for depositing a silicon oxide film onto a substrate comprising the steps of: a. providing a substrate in a reactor; b. introducing into the reactor at least one silicon precursor wherein the at least one silicon precursor has a structure represented by Formula I:

$$R^1R^2{}_mSi(NR^3R^4)_n \qquad (I)$$

wherein $R^1$, $R^2$, and $R^3$ are each independently selected from a linear or branched $C_1$ to $C_{10}$ alkyl group, and a $C_6$ to $C_{10}$ aryl group; $R^4$ is selected from hydrogen, a linear or branched $C_1$ to $C_{10}$ alkyl group, and a $C_6$ to $C_{10}$ aryl group, and a $C_3$ to $C_{10}$ alkylsilyl group; m is 0 to 2; and n is 1 to 3, wherein m+n=3; c. purging reactor with purge gas; d. introducing an oxygen source into the reactor; and e. purging reactor with purge gas, wherein steps b through e are repeated until a desired thickness of silicon oxide is deposited, and wherein the process in conducted at one or more temperatures ranging from 600 to 800° C. and one or more pressures ranging from 50 miliTorr (mT) to 760 Torr.

In another embodiment, there is disclosed a process for depositing a silicon oxide film comprising the steps of: a. providing a substrate in a reactor; b. introducing into the reactor at least one silicon precursor wherein the at least one silicon precursor has a structure represented by Formula I:

$$R^1R^2{}_mSi(NR^3R^4)_n \qquad (I),$$

wherein $R^1$, $R^2$, and $R^3$ are each independently selected from a linear or branched $C_1$ to $C_{10}$ alkyl group, and a $C_6$ to $C_{10}$ aryl group; $R^4$ is selected from hydrogen, a linear or branched $C_1$ to $C_{10}$ alkyl group, and a $C_6$ to $C_{10}$ aryl group, and a $C_3$ to $C_{10}$ alkylsilyl group; m is 0 to 2; and n is 1 to 3, wherein m+n=3; c. purging reactor with purge gas; d. introducing an oxygen source into the reactor; e. purging reactor with purge gas; f. introducing water vapor or an OH source into the reactor; and g. purging reactor with purge gas, wherein steps b through g are repeated until a desired thickness is deposited, and wherein process temperature ranges from 600 to 800° C. and pressure in the reactor ranges from 50 mT to 760 Torr.

The silicon oxide films disclosed herein and made from either of the above methods have a leakage current $1.0e^{-9}$ A/cm$^2$ or lower at 2 MW/cm, or $1.0e^{-9}$ A/cm$^2$ or lower at 4 MV/cm, or $1.0e^{-8}$ A/cm$^2$ or lower at 6 MV/cm.

Other features and advantages of the present invention will be apparent from the following more detailed description of the preferred embodiment, taken in conjunction with the accompanying drawings which illustrate, by way of example, the principles of the invention. The embodiments and features of the present invention can be used alone or in combinations with each other.

DETAILED DESCRIPTION OF THE INVENTION

Described herein are compositions and processes related to the formation of a silicon oxide containing film, such as a silicon oxynitride film, a stoichiometric or non-stoichiometric silicon oxide film, a silicon oxide film or combinations, thereof with one or more temperatures, of 600° C. or greater, preferably 700° C. or greater, most preferably 720° C. or greater, in an ALD or in an ALD-like process, such as without limitation a cyclic chemical vapor deposition process (CCVD). The high temperature deposition (e.g., one or more deposition temperatures ranging from about 600 to 800° C.) methods described herein provide films or materials that exhibit at least one or more of the following advantages: a density of about 2.1 g/cm$^3$ or greater, low chemical impurity, high conformality in a thermal atomic layer deposition, a PEALD process or a PEALD-like process, an ability to adjust carbon content in the resulting film; and/or films have an etching rate of 5 Angstroms per second (A/sec) or less when measured in 0.5 wt % dilute HF. For carbon-doped silicon oxide films, greater than 1% carbon is desired to tune the etch rate to values below 2 Å/sec in 0.5 wt % dilute HF in addition to other characteristics such as, without limitation, a density of about 1.8 g/cm$^3$ or greater or about 2.0 g/cm$^3$ or greater. Importantly, the deposited silicon oxide has a leakage current of $1.0e^{-9}$ A/cm$^2$ or lower at 2 MW/cm, or $1.0e^{-9}$ A/cm$^2$ or lower at 4 MV/cm, or $1.0e^{-8}$ A/cm$^2$ or lower at 6 MV/cm.

Typical ALD processes in the prior art use an oxygen source, or oxidizer such as oxygen, oxygen plasma, water vapor, water vapor plasma, hydrogen peroxide, or ozone source directly to form SiO$_2$ at process temperatures ranging from 25 to 500° C. The deposition steps comprises of:

a. providing a substrate in a reactor b. introducing into the reactor a silicon precursor c. purging reactor with purge gas d. introducing oxygen source into the reactor; and e. purging reactor with purge gas.

In such prior art process, steps b through e are repeated until desired thickness of film is deposited It is believed that high temperature processes, i.e., above 600° C., may yield better film quality in term of film purity and density. An ALD process provides good film step coverage, however, typical organosilicon precursors used in ALD or PEALD only deposit films in ALD mode within a temperature range typically below 500° C. When temperature is higher than this range, thermal decomposition of the precursor occurs which causes either gas phase reaction or continuous substrate surface reaction which changes the deposition process to CVD mode, rather than the desired ALD mode.

Without intending to be bound by a particular theory, for ALD or ALD-like deposition processes at one or more temperatures greater than 600° C., the silicon precursor molecules described herein have at least one anchoring functionality, which reacts with certain reactive sites on the substrate surface to anchor a monolayer of silicon species. The anchoring functionalities can be selected an amino-group such as dimethylamino or diethylamino groups. The silicon precursor should also have a passive functionality in that it is chemically stable as to prevent further surface reaction, leading to a self-limiting process. The passivating functionality is selected from different alkyl groups such as methyl, ethyl, phenyl groups, preferably a methyl group. The remaining groups on the surface can then be oxidized to form a Si—O—Si linkage as well as hydroxyl groups. In addition, hydroxyl sources such as H$_2$O or water plasma can also be introduced into the reactor to form more hydroxyl groups as reactive sites for the next ALD cycle as demonstrated in the following Scheme 1.

ALD SiO₂

In one embodiment, the at least one silicon precursor described herein is a compound having the following Formula I:

$$R^1R^2_mSi(NR^3R^4)_n \qquad (I)$$

wherein $R^1$, $R^2$, and $R^3$ are each independently selected from a linear or branched $C_1$ to $C_{10}$ alkyl group, and a $C_6$ to $C_{10}$ aryl group; $R^4$ is selected from hydrogen, a linear or branched $C_1$ to $C_{10}$ alkyl group, and a $C_6$ to $C_{10}$ aryl group, a $C_3$ to $C_{10}$ alkylsilyl group; wherein $R^3$ and $R^4$ are linked to form a cyclic ring structure or $R^3$ and $R^4$ are not linked to form a cyclic ring structure; m is 0 to 2; n is 1 to 3; and m+n=3; and wherein the silicon precursor is substantially free of one or more impurities selected from the group consisting of halide compounds, metal ions, metals, and combinations thereof.

Examples of precursors having Formula I include are but not limited to: diethylaminotrimethylsilane, dimethylaminotrimethylsilane, ethylmethylaminotrimethylsilane, diethylaminotriethylsilane, dimethylaminotriethylsilane, ethylmethylaminotriethylsilane, t-butylaminotriethylsilane, iso-propylaminotriethylsilane, di-isopropylaminotriethylsilane, pyrrolidinotriethylsilane, t-butylaminotrimethylsilane, iso-propylaminotrimethylsilane, di-isopropylaminotrimethylsilane, pyrrolidinotrimethylsilane, diethylaminodimethylsilane, dimethylaminodimethylsilane, ethylmethylaminodimethylsilane, t-butylaminodimethylsilane, iso-propylaminodimethylsilane, di-isopropylaminodimethylsilane, pyrrolidinodimethylsilane, diethylaminodiethylsilane, dimethylaminodiethylsilane, ethylmethylaminodiethylsilane, t-butylaminodiethylsilane, iso-propylaminodiethylsilane, di-isopropylaminodiethylsilane, pyrrolidonodiethylsilane, bis(diethylamino)dimethylsilane, bis(dimethylamino)dimethylsilane, bis(dimethylamino)methylsilane, bis(ethylmethylamino)dimethylsilane, bis(di-isopropyllamino)dimethylsilane, bis(iso-propylamino)dimethylsilane, bis(tert-butylamino)dimethylsilane, dipyrrolidinodimethylsilane, bis(diethylamino)diethylsilane, bis(dimethylamino)diethylsilane, bis(ethylmethylamino)diethylsilane, bis(di-isopropyllamino)diethylsilane, bis(iso-propylamino)diethylsilane, bis(tert-butylamino)diethylsilane, dipyrrolidinodiethylsilane, bis(diethylamino)methylvinylsilane, bis(dimethylamino)methylvinylsilane bis(ethylmethylamino)methylvinylsilane, bis(di-isopropyllamino)methylvinylsilane, bis(iso-propylamino)methylvinylsilane, bis(tert-butylamino)methylvinylsilane, dipyrrolidinomethylvinylsilane, 2,6-dimethylpiperidinomethylsilane, 2,6-dimethylpiperidinodimethylsilane, 2,6-dimethylpiperidinotrimethylsilane, tris(dimethylamino)phenylsilane, tris(dimethylamino)methylsilane, tris(dimethylamino)ethylsilane, tris(dimethylamino)chlorosilane, methylaminotrimethylsilane, n-propylaminotrimethylsilane, iso-butylaminotrimethylsilane, n-butylaminotrimethylsilane, cyclohexaminotrimethylsilane, 2-methylpyrrolidinotrimethylsilane, 2,5-dimethylpyrrolidinotrimethylsilane, piperidinotrimethylsilane, 1-methylpiperazinotrimethylsilane, pyrrolyltrimethylsilane, 2,5-dimethylpyrrolyltrimethylsilane, imidazolyltrimethylsilane, methoxytrimethylsilane, ethoxytrimethylsilane, and mixtures thereof.

The precursors having the structure of Formula I have an anchoring functionality selected from an amine group and an alkoxy group and have an alkyl group passivating functionally which is preferably a methyl group. Without intending to be bound by a particular theory, it is believed that the Si-Me groups are stable at temperatures higher than 600° C. and provide a passivation functionality to prevent further surface reaction, leading to a self-limiting ALD or ALD-like process.

In the formulas above and throughout the description, the term "alkyl" denotes a linear or branched functional group having from 1 to 10, 3 to 10, or 1 to 6 carbon atoms. Exemplary linear alkyl groups include, but are not limited to, methyl, ethyl, propyl, butyl, pentyl, and hexyl groups. Exemplary branched alkyl groups include, but are not limited to, isopropyl, isobutyl, sec-butyl, tert-butyl, iso-pentyl, tert-pentyl, isohexyl, and neohexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulas above and throughout the description, the term "aryl" denotes an aromatic cyclic functional group having from 3 to 10 carbon atoms, from 5 to 10 carbon atoms, or from 6 to 10 carbon atoms. Exemplary aryl groups include, but are not limited to, phenyl, benzyl, chlorobenzyl, tolyl, and o-xylyl.

In the formulas above and throughout the description, the term "amino" denotes an alkyl or aromatic group which is linked to a nitrogen atom (e.g., $NR^3R^4$ defined as above) and may have from 1 to 12 or from 1 to 6 carbon atoms. Exemplary amino groups include, but are not limited to, dimethylamino, diethylamino, tert-butylamino, cyclohexylamino, piperidino, alkyl substituted piperidino (for example 2,6-dimethylpiperdino), pyrrolidino, alkyl substituted pyrrolidino (for example 2,5-dimethylpyrrolidino), pyrrolyl, alkyl-substituted pyrrolyl, imidazolyl, and alkyl substituted imidazolyl groups.

In the formulas above and through the description, the term "unsaturated" as used herein means that the functional group, substituent, ring or bridge has one or more carbon double or triple bonds. An example of an unsaturated ring can be, without limitation, an aromatic ring such as a phenyl ring. The term "saturated" means that the functional group, substituent, ring or bridge does not have one or more double or triple bonds.

In the formulas above and throughout the description, the term "alkylsilyl" denotes a linear or branched functional group having from 3 to 10. Exemplary alkylsilyl groups include, but are not limited to, trimethylsilyl, triethylsilyl, dimethylsilyl, diethylsilyl, and dimethylethylsilyl.

In certain embodiments, substituents $R^3$ and $R^4$ in Formula I can be linked together to form a ring structure. As the skilled person will understand, where $R^3$ and $R^4$ are linked together to form a ring $R^3$ will include a bond for linking to $R^4$ and vice versa. In these embodiments, the ring structure can be unsaturated such as, for example, a cyclic alkyl ring, or saturated, for example, an aryl ring. Further, in these embodiments, the ring structure can also be substituted or substituted. Exemplary cyclic ring groups include, but not limited to, pyrrolidino, piperidino, and 2, 6-dimethylpiperidino groups. In other embodiments, however, substituent $R^3$ and $R^4$ are not linked.

The precursors of Formula I can be produced by following reaction equation (1):

(1)

The reaction in Equation (1) can be conducted with (e.g., in the presence of) or without (e.g., in the absence of) organic solvents. In embodiments wherein an organic solvent is used, examples of suitable organic solvents include, but are not limited to, hydrocarbon such as hexanes, octane, toluene, and ethers such as diethylether and tetrahydrofuran (THF). In these or other embodiments, the reaction temperature is in the range of from about −70° C. to the boiling point of the solvent employed if a solvent is used. The resulting silicon precursor compound can be purified, for example, via vacuum distillation after removing all by-products as well as any solvent(s) if present.

Compositions according to the present invention that are substantially free of halides can be achieved by (1) reducing or eliminating chloride sources during chemical synthesis, and/or (2) implementing an effective purification process to remove chloride from the crude product such that the final purified product is substantially free of chlorides. Chloride sources may be reduced during synthesis by using reagents that do not contain halides such as chlorosilanes, bromosilanes, or iodosilanes thereby avoiding the production of by-products that contain halide ions. In addition, the aforementioned reagents should be substantially free of chloride impurities such that the resulting crude product is substantially free of chloride impurities. In a similar manner, the synthesis should not use halide-based solvents, catalysts, or solvents which contain unacceptably high levels of halide contamination. The crude product may also be treated by various purification methods to render the final product substantially free of halides such as chlorides. Such methods are well described in the prior art and, may include, but are not limited to, purification processes such as distillation, or adsorption. Distillation is commonly used to separate impurities from the desire product by exploiting differences in boiling point. Adsorption may also be used to take advantage of the differential adsorptive properties of the components to effect separation such that the final product is substantially free of halide. Adsorbents such as, for example, commercially available $MgO\text{---}Al_2O_3$ blends can be used to remove halides such as chloride.

Equation (1) is an exemplary synthetic route to make the silicon precursor compound having Formula I involving a reaction between halidotrialkylsilane and a primary or secondary amine as described in literatures. Other synthetic routes such as equations (2) or (3) may be also employed to make these silicon precursor compounds having Formula I as disclosed in the prior art.

The catalyst employed in the method of the present invention is one that promotes the formation of a silicon-nitrogen bond, i.e., dehydro-coupling catalyst. Exemplary catalysts that can be used with the method described herein include, but are not limited to the following: alkaline earth metal catalysts; halide-free main group, transition metal, lanthanide, and actinide catalysts; and halide-containing main group, transition metal, lanthanide, and actinide catalysts.

Exemplary alkaline earth metal catalysts include but are not limited to the following: $Mg[N(SiMe_3)_2]_2$, $To^M MgMe$ [$To^M$=tris(4,4-dimethyl-2-oxazolinyl)phenylborate], $To^M Mg\text{---}H$, $To^M Mg\text{---}NR_2$ (R=H, alkyl, aryl) $Ca[N(SiMe_3)_2]_2$, [(dipp-nacnac)CaX(THF)]$_2$ (dipp-nacnac=CHRCMe)(2,6-$^i$Pr$_2$-C$_6$H$_3$M$_2$; X=H, alkyl, carbosilyl, organoamino), $Ca(CH_2Ph)_2$, $Ca(C_3H_5)_2$, Ca(α-Me$_3$Si-2-(Me$_2$N)-benzyl)$_2$(THF)$_2$, Ca(9-(Me$_3$Si)-fluorenyl)(α-Me$_3$Si-2-(Me$_2$N)-benzyl)(TH F), [(Me$_3$TACD)$_3$Ca$_3$(µ$^3$-H)$_2$]+(Me$_3$TACD=Me$_3$[12]aneN$_4$), Ca(η$^2$-Ph$_2$CNPh)(hmpa)$_3$ (hmpa=hexamethylphosphoramide), $Sr[N(SiMe_3)_2]_2$, and other M$^{2+}$ alkaline earth metal-amide, -imine, -alkyl, -hydride, and -carbosilyl complexes (M=Ca, Mg, Sr, Ba).

Exemplary halide-free, main group, transition metal, lanthanide, and actinide catalysts include but are not limited to the following: 1,3-di-iso-propyl-4,5-dimethylimidazol-2-ylidene, 2,2'-bipyridyl, phenanthroline, $B(C_6F_5)_3$, $BR_3$ (R=linear, branched, or cyclic $C_1$ to $C_{10}$ alkyl group, a $C_5$ to $C_{10}$ aryl group, or a $C_1$ to $C_{10}$ alkoxy group), $AlR_3$ (R=linear, branched, or cyclic $C_1$ to $C_{10}$ alkyl group, a $C_5$ to $C_{10}$ aryl group, or a $C_1$ to $C_{10}$ alkoxy group), $(C_5H_5)_2TiR_2$ (R=alkyl, H, alkoxy, organoamino, carbosilyl), $(C_5H_5)_2Ti(OAr)_2$ [Ar=(2,6-($^i$Pr)$_2$C$_6$H$_3$)], $(C_5H_5)_2Ti(SiHRR')PMe_3$ (wherein R, R' are each independently selected from H, Me, Ph), $TiMe_2$(dmpe)$_2$ (dmpe=1,2-bis(dimethylphosphino)ethane), bis(benzene)chromium(0), $Cr(CO)_6$, $Mn_2(CO)_{12}$, $Fe(CO)_5$, $Fe_3(CO)_{12}$, $(C_5H_5)Fe(CO)_2Me$, $Co_2(CO)_8$, Ni(II) acetate, Nickel(II) acetylacetonate, Ni(cyclooctadiene)$_2$, [(dippe)Ni(µ-H)]$_2$ (dippe=1,2-bis(di-iso-propylphosphino)ethane), (R-indenyl)Ni(PR'$_3$)Me (R=1-SiMe$_3$, 1,3-(SiMe$_3$)$_2$; R'=Me, Ph), [{Ni(n-CH$_2$:CHSiMe$_2$)$_2$O}$_2${µ-(η-CH$_2$:CHSiMe$_2$)$_2$O}], Cu(I) acetate, CuH, [tris(4,4-dimethyl-2-oxazolinyl) phenylborate]ZnH, $(C_5H_5)_2ZrR_2$ (R=alkyl, H, alkoxy, organoamino, carbosilyl), $Ru_3(CO)_{12}$, [(Et$_3$P)Ru(2,6-dimesitylthiophenolate)][B[3,5-(CF$_3$)$_2$C$_6$H$_3$]$_4$], [(C$_5$Me$_5$)Ru(R$_3$P)$_x$(NCMe)$_{3-x}$]$^+$ (wherein R is selected from a linear, branched, or cyclic $C_1$ to $C_{10}$ alkyl group and a $C_5$ to $C_{10}$ aryl group; x=0, 1, 2, 3), $Rh_6(CO)_{16}$, tris(triphenylphosphine)rhodium(I)carbonyl hydride, $Rh_2H_2(CO)_2(dppm)_2$ (dppm=bis(diphenylphosphino)methane, $Rh_2(\mu\text{-SiRH})_2(CO)_2(dppm)_2$ (R=Ph, Et, $C_6H_{13}$), Pd/C, tris(dibenzylideneacetone)dipalladium(0), tetrakis(triphenylphosphine)palladium(0), Pd(II) acetate, $(C_5H_5)_2SmH$, $(C_5Me_5)_2SmH$, $(THF)_2Yb[N(SiMe_3)_2]_2$, $(NHC)Yb(N(SiMe_3)_2)_2$ [NHC=1,3-bis(2,4,6-trimethylphenyl) imidazol-2-ylidene)], Yb(η$^2$-Ph$_2$CNPh)(hmpa)$_3$ (hmpa=hexamethylphosphoramide), $W(CO)_6$, $Re_2(CO)_{10}$, $Os_3(CO)_{12}$, $Ir_4(CO)_{12}$, (acetylacetonato)dicarbonyliridium(I), $Ir(Me)_2(C_5Me_5)L$ (L=PMe$_3$, PPh$_3$), [Ir(cyclooctadiene)OMe]$_2$, $PtO_2$ (Adams's catalyst), platinum on carbon (Pt/C), ruthenium on carbon (Ru/C), palladium on carbon, nickel on carbon, osmium on carbon, Platinum(0)-1,3-divinyl-1,1,3,3-tetramethyldisiloxane (Karstedt's catalyst), bis(tri-tert-butylphosphine)platinum(0), Pt(cyclooctadiene)$_2$, [(Me$_3$SO$_2$N]$_3$U][BPh$_4$], [(Et$_2$N)$_3$U][BPh$_4$], and other halide-free M$^{n+}$ complexes (M=Sc, Ti, V, Cr, Mn, Fe, Co, Ni, Cu, Zn, Y, Zr, Nb, Mo, Ru, Rh, Pd, La, Ce, Pr, Nd, Pm, Sm, Eu, Gd, Tb, Dy, Ho, Er, Tm, Yb, Lu, Hf, Ta, W, Re, Os, Ir, Pt, U; n=0, 1, 2, 3, 4, 5, 6).

Exemplary halide-containing, main group, transition metal, lanthanide, and actinide catalysts include but are not limited to the following: $BX_3$ (X=F, Cl, Br, I), $BF_3 \cdot OEt_2$, $AlX_3$ (X=F, Cl, Br, I), $(C_5H_5)_2TiX_2$ (X=F, Cl), $[Mn(CO)_4Br]_2$, $NiCl_2$, $(C_5H_5)_2ZrX_2$ (X=F, Cl), $PdCl_2$, $PdI_2$, CuCl, CuI, $CuF_2$, $CuCl_2$, $CuBr_2$, $Cu(PPh_3)_3Cl$, $ZnCl_2$, $[(C_6H_6)RuX_2]_2$ (X=Cl, Br, I), $(Ph_3P)_3RhCl$ (Wilkinson's catalyst), [RhCl(cyclooctadiene)]$_2$, di-μ-chloro-tetracarbonyldirhodium(I), bis(triphenylphosphine)rhodium(I) carbonyl chloride, $NdI_2$, $SmI_2$, $DyI_2$, (POCOP)IrHCl (POCOP=2,6-$(R_2PO)_2C_6H_3$; R=$^i$Pr, $^n$Bu, Me), $H_2PtCl_6 \cdot nH_2O$ (Speier's catalyst), $PtCl_2$, $Pt(PPh_3)_2Cl_2$, and other halide-containing $M^{n+}$ complexes (M=Sc, Ti, V, Cr, Mn, Fe, Co, Ni, Cu, Zn, Y, Zr, Nb, Mo, Ru, Rh, Pd, La, Ce, Pr, Nd, Pm, Sm, Eu, Gd, Tb, Dy, Ho, Er, Tm, Yb, Lu, Hf, Ta, W, Re, Os, Ir, Pt, U; n=0, 1, 2, 3, 4, 5, 6).

The silicon precursor compounds having Formula I according to the present invention and compositions comprising the silicon precursor compounds having Formula I according to the present invention are preferably substantially free of halide ions. As used herein, the term "substantially free" as it relates to halide ions (or halides) such as, for example, chlorides (i.e. chloride-containing species such as HCl or silicon compounds having at least one Si—Cl bond such as $Me_3SiCl$) and fluorides, bromides, and iodides, means less than 5 ppm (by weight) measured by ion chromatography (IC), preferably less than 3 ppm measured by ion chromatography (IC), and more preferably less than 1 ppm measured by ion chromatography (IC), and most preferably 0 ppm measured by ion chromatography (IC). It is believed that significant levels of chloride in the final product can be detrimental to the device performance such as higher leakage current. The silicon precursor compounds having Formula I are also preferably substantially free of metal ions or metal impurities such as, $Li^+$, $Al^{3+}$, $Fe^{2+}$, $Fe^{2+}$, $Fe^{3+}$, $Ni^{2+}$, $Cr^{3+}$, volatile metal complexes. As used herein, the term "substantially free" as it relates to Li, Al, Fe, Ni, Cr means less than 5 ppm (by weight), preferably less than 3 ppm, and more preferably less than 1 ppm, and most preferably 0.1 ppm as measured by ICP-MS. In some embodiments, the silicon precursor compounds having Formula I are free of metal ions such as, $Li^+$, $Al^{3+}$, $Fe^{2+}$, $Fe^{3+}$, $Ni^{2+}$, $Cr^{3+}$. As used herein, the term "free of" as it relates to Li, Al, Fe, Ni, Cr, noble metal such as Ru or Pt (ruthenium (Ru) or platinum (Pt) from the catalysts used in the synthesis), means less than 1 ppm (by weight) as measured by ICP-MS, preferably less than 0.1 ppm as measured by ICP-MS, and more preferably less than 0.01 ppm as measured by ICP-MS, and most preferably 1 ppb as measured by ICP-MS. In addition, the silicon precursor compounds having Formula I are also preferably substantially free of silicon-containing impurities such as alkylsiloxanes which may have impact on the growth, for example hexamethyldisiloxane.

In certain embodiments, the silicon films deposited using the methods described herein are formed in the presence of oxygen using an oxygen source, reagent or precursor comprising oxygen. An oxygen source may be introduced into the reactor in the form of at least one oxygen source and/or may be present incidentally in the other precursors used in the deposition process. Suitable oxygen source gases may include, for example, water ($H_2O$) (e.g., deionized water, purifier water, and/or distilled water), oxygen ($O_2$), mixture of oxygen and hydrogen, oxygen plasma, ozone ($O_3$), $N_2O$, $NO_2$, carbon monoxide (CO), carbon dioxide ($CO_2$) and combinations thereof. In certain embodiments, the oxygen source comprises an oxygen source gas that is introduced into the reactor at a flow rate ranging from about 1 to about 2000 standard cubic centimeters (sccm) or from about 1 to about 1000 sccm. The oxygen source can be introduced for a time that ranges from about 0.1 to about 100 seconds. In one particular embodiment, the oxygen source comprises water having a temperature of 10° C. or greater. In embodiments wherein the film is deposited by an ALD or a cyclic CVD process, the precursor pulse can have a pulse duration that is greater than 0.01 seconds, and the oxygen source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between. The oxygen source or reagent is provided in a molecular amount less than a 1:1 ratio to the silicon precursor, so that at least some carbon is retained in the as deposited dielectric film.

In certain embodiments, the silicon oxide films further comprises nitrogen. In these embodiments, the films are deposited using the methods described herein and formed in the presence of nitrogen-containing source. A nitrogen-containing source may be introduced into the reactor in the form of at least one nitrogen source and/or may be present incidentally in the other precursors used in the deposition process. Suitable nitrogen-containing source gases may include, for example, ammonia, hydrazine, monoalkylhydrazine, dialkylhydrazine, nitrogen, nitrogen/hydrogen, ammonia plasma, nitrogen plasma, nitrogen/hydrogen plasma, and mixture thereof. In certain embodiments, the nitrogen-containing source comprises an ammonia plasma or hydrogen/nitrogen plasma source gas that is introduced into the reactor at a flow rate ranging from about 1 to about 2000 square cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process, the precursor pulse can have a pulse duration that is greater than 0.01 seconds, and the nitrogen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, hydrogen ($H_2$), and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

The respective step of supplying the precursors, oxygen source, the nitrogen-containing source, and/or other precursors, source gases, and/or reagents may be performed by changing the time for supplying them to change the stoichiometric composition of the resulting dielectric film.

Energy is applied to the at least one of the silicon precursor, oxygen containing source, or combination thereof to induce reaction and to form the dielectric film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The at least one silicon precursors may be delivered to the reaction chamber such as a cyclic CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

For those embodiments wherein the at least one silicon precursor precursor(s) having Formula I is used in a composition comprising a solvent and an at least one silicon precursor having Formula I described herein, the solvent or mixture thereof selected does not react with the silicon precursor. The amount of solvent by weight percentage in the composition ranges from 0.5% by weight to 99.5% or from 10% by weight to 75%. In this or other embodiments, the solvent has a boiling point (b.p.) similar to the b.p. of the at least one silicon precursor of Formula I or the difference between the b.p. of the solvent and the b.p. of the t least one silicon precursor of Formula I is 40° C. or less, 30° C. or less, or 20° C. or less, or 10° C. or less. Alternatively, the difference between the boiling points ranges from any one or more of the following end-points: 0, 10, 20, 30, or 40° C. Examples of suitable ranges of b.p. difference include without limitation, 0 to 40° C., 20° to 30° C., or 10° to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N', N'-Tetramethylethylenediamine), a nitrile (such as benzonitrile), an alkane (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

As previously mentioned, the purity level of the at least one silicon precursor of Formula I is sufficiently high enough to be acceptable for reliable semiconductor manufacturing. In certain embodiments, the at least one silicon precursor of Formula I described herein comprises less than 2% by weight, or less than 1% by weight, or less than 0.5% by weight of one or more of the following impurities: free amines, free halides or halogen ions, and higher molecular weight species. Higher purity levels of the silicon precursor described herein can be obtained through one or more of the following processes: purification, adsorption, and/or distillation.

In one embodiment of the method described herein, a cyclic deposition process such as ALD-like, ALD, or PEALD may be used wherein the deposition is conducted using the at least one silicon precursor of Formula I and an oxygen source. The ALD-like process is defined as a cyclic CVD process but still provides high conformal silicon oxide films.

In certain embodiments, the gas lines connecting from the precursor canisters to the reaction chamber are heated to one or more temperatures depending upon the process requirements and the container of the at least one silicon precursor of Formula I is kept at one or more temperatures for bubbling. In other embodiments, a solution comprising the at least one silicon precursor of Formula I is injected into a vaporizer kept at one or more temperatures for direct liquid injection.

A flow of argon and/or other gas may be employed as a carrier gas to help deliver the vapor of the at least one silicon precursor of Formula I to the reaction chamber during the precursor pulsing. In certain embodiments, the reaction chamber process pressure is about 1 Torr.

In a typical ALD or an ALD-like process such as a CCVD process, the substrate such as a silicon oxide substrate is heated on a heater stage in a reaction chamber that is exposed to the silicon precursor initially to allow the complex to chemically adsorb onto the surface of the substrate.

A purge gas such as argon purges away unabsorbed excess complex from the process chamber. After sufficient purging, an oxygen source may be introduced into reaction chamber to react with the absorbed surface followed by another gas purge to remove reaction by-products from the chamber. The process cycle can be repeated to achieve the desired film thickness. In some cases, pumping can replace a purge with inert gas or both can be employed to remove unreacted silicon precursors.

In this or other embodiments, it is understood that the steps of the methods described herein may be performed in a variety of orders, may be performed sequentially, may be performed concurrently (e.g., during at least a portion of another step), and any combination thereof. The respective step of supplying the precursors and the oxygen source gases may be performed by varying the duration of the time for supplying them to change the stoichiometric composition of the resulting dielectric film.

One particular embodiment of the method described herein to deposit a silicon oxide film on a substrate comprises the following steps:
 a. providing a substrate in a reactor
 b. introducing into the reactor at least one silicon precursor described herein having Formula I
 c. purging the reactor with purge gas
 d. introducing oxygen source into the reactor and
 e. purging the reactor with purge gas,
wherein steps b through e are repeated until a desired thickness of the silicon oxide film is deposited.

Another embodiment of the method described herein introduces a hydroxyl or OH source such as H$_2$O vapor after the oxidizing step. The goal in this embodiment to repopulate the anchoring functionality or reactive sites for silicon precursor which anchor on the surface to form the monolayer. The deposition steps are comprised of:
 a. providing a substrate in a reactor;
 b. introducing into the reactor one silicon precursor of Formula I;
 c. purging the reactor with purge gas;
 d. introducing an oxygen source into the reactor;
 e. purging the reactor with purge gas;
 f. introducing water vapor or other hydroxyl source into the reactor; and
 g. purging the reactor with purge gas, wherein steps b through g are repeated until a desired thickness is deposited.

In an alternative embodiment of the method described herein, the deposition steps are comprised of:
a. providing a substrate in a reactor;
b. introducing into the reactor one silicon precursor of Formula I;
c. purging reactor with purge gas;
d. introducing oxygen source into the reactor;
e. purging reactor with purge gas;
f. introducing water vapor or OH source into the reactor; and
g. purging reactor with purge gas, wherein steps b through i are repeated until a desired thickness is deposited.

Yet another embodiment employs a hydrogen peroxide or oxygen plasma to remove a passivating functionality or group such as methyl. The deposition steps are as follows:
a. providing a substrate in a reactor;
b. introducing into the reactor one silicon precursor of Formula I;
c. purging the reactor with purge gas;
d. introducing ozone, hydrogen peroxide or oxygen plasma into the reactor; and
e. purging the reactor with purge gas, wherein steps b through e are repeated until a desired film thickness is deposited Process temperature for the method described herein are one or more temperatures ranging from 600° C. to 1000° C.; or 600° C. to 750° C.; or 600° C. to 750° C.; or 600° C. to 800° C.

Deposition pressure ranges are one or more pressures ranging from 50 mT to 760 Torr, or from 500 mT-100 Torr. Purge gas can be selected from inert gas such as nitrogen, helium or argon. Oxygen source is selected from oxygen, peroxide, ozone or molecular oxygen from plasma process.

EXAMPLES

Comparative Example 1: Atomic Layer Deposition of Silicon Oxide Films with Dimethylaminotrimethylsilane with >50 ppm Chloride Impurities Atomic layer deposition of silicon oxide films was conducted using the following precursors: dimethylaminotrimethylsilane (DMATMS). The depositions were performed on a laboratory scale ALD processing tool. The silicon precursor was delivered to the chamber by vapor draw. All gases (e.g., purge and reactant gas or precursor and oxygen source) were preheated to 100° C. prior to entering the deposition zone. Gases and precursor flow rates were controlled with ALD diaphragm valves with high speed actuation. The substrates used in the deposition were 12-inch long silicon strips. A thermocouple was attached on the sample holder to confirm substrate temperature. Depositions were performed using ozone as an oxygen source gas. Deposition parameters are provided in Table I.

TABLE I

Process for Atomic Layer Deposition of Silicon Oxide Films with Ozone Using DMATMS

| a | 6 sec | Evacuate reactor | <100 mT |
| b | Variable | Dose silicon precursor | Reactor pressure typically <2 Torr |
| c | 6 sec | Purge reactor with nitrogen | Flow 1.5 slpm $N_2$ and Evacuate reactor to <100 mT |
| d | 4 sec | Dose ozone, 16-20% wt | |
| e | 6 sec | Purge reactor with nitrogen | Flow 1.5 slpm $N_2$ |

Steps b to e were repeated until a desired thickness was reached. Thickness and refractive indices of the films were measured using a FilmTek 2000SE ellipsometer by fitting the reflection data from the film to a pre-set physical model (e.g., the Lorentz Oscillator model). Wet etch rate was performed using 1:99 volume diluted solution of 49 wt. % hydrofluoric (HF) acid in deionized water. Thermal oxide wafers were used as reference for each batch to confirm solution concentration. Typical thermal oxide wafer wet etch rate for about 0.5 wt. % HF in water solution is 0.5 Å/s. Film thickness before and after etch was used to calculate wet etch rate. Carbon and nitrogen concentration in the films were analyzed with Dynamic Secondary Ions Mass Spectrometry (SIMS) technique. The % non-uniformity was calculated from 6-point measurements using the following equation: % non-uniformity=((max−min)/(2*mean)). Film density was characterized with X-ray reflectometry (XRR).

Figure 1:
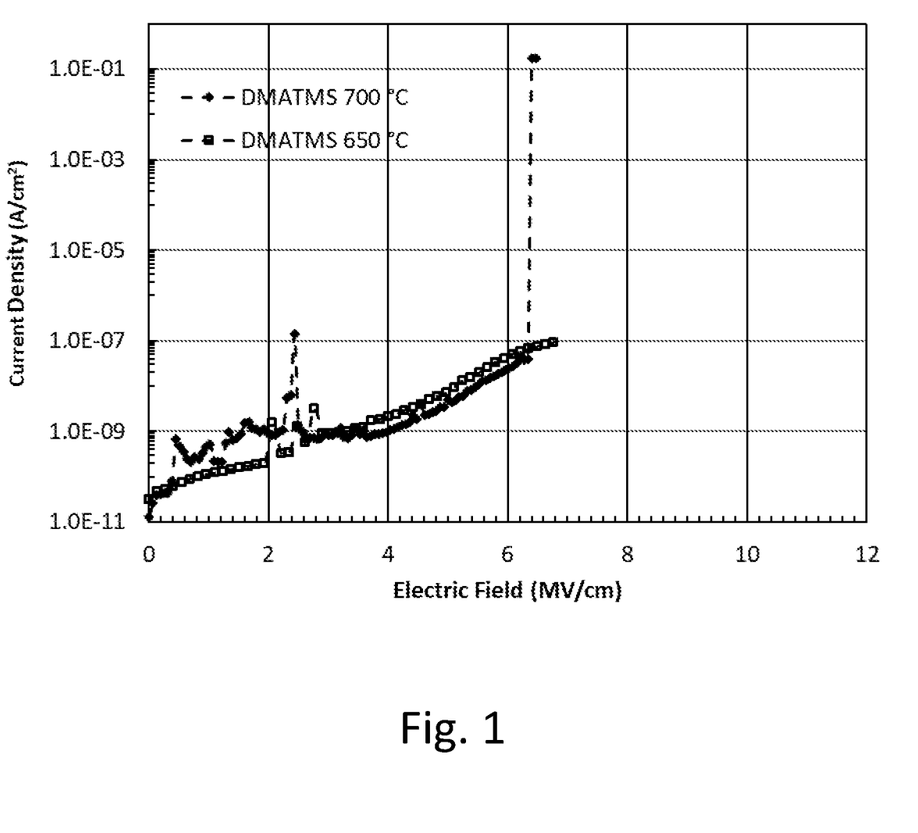
FIG. 1 is a leakage current curve of silicon oxide film deposited with DMATMS with >50 ppm chloride impurities at 650° C. and 700° C., respectively. The film leakage current is above $1.0e^{-9}$ A/cm$^2$ at 2 MW/cm, above $1.0e^{-9}$ A/cm$^2$ at 4 MV/cm, above $1.0e^{-8}$ A/cm$^2$ at 6 MV/cm.

FIG. 1 depicts the leakage current curve for silicon oxide deposited with DMATMS with >50 ppm chloride impurities at 650° C. and 700° C., respectively. The film leakage current is above $1.0e^{-9}$ A/cm$^2$ at 2 MW/cm, above $1.0e^{-9}$ A/cm$^2$ at 4 MV/cm, above $1.0e^{-8}$ A/cm$^2$ at 6 MV/cm. Film densities for silicon oxides deposited from DMATMS ranged from 2.08 to 2.23 g/cm$^3$.

Figure 2:
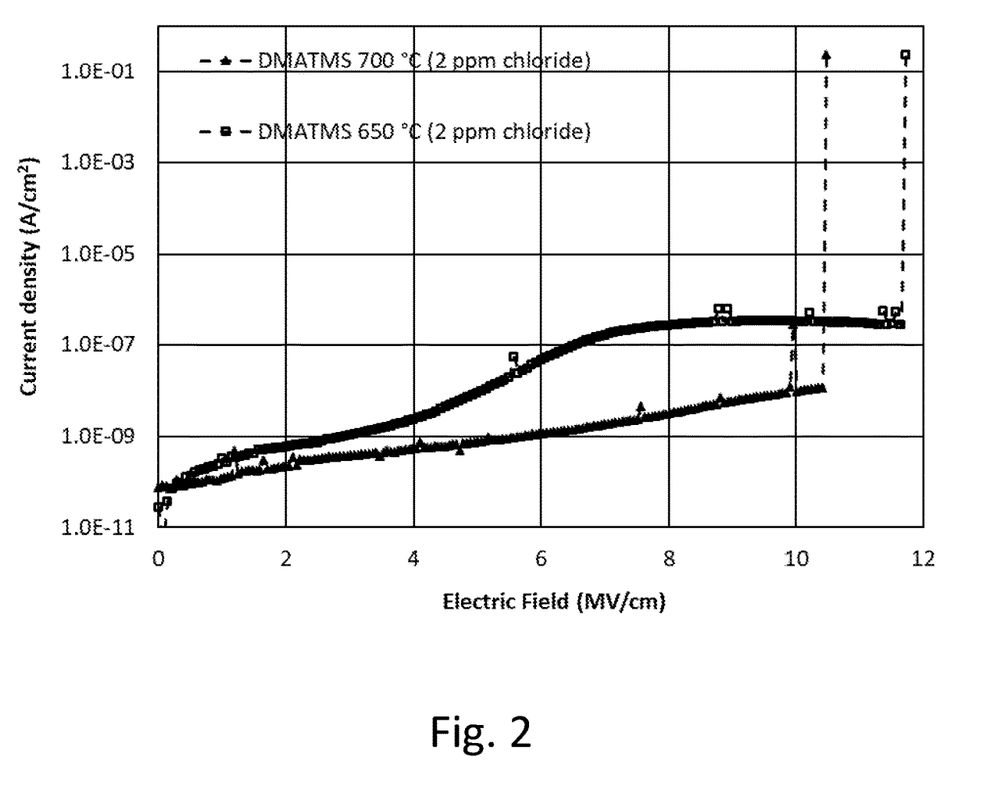
FIG. 2 is a leakage current curve of silicon oxide film deposited with DMATMS with 2 ppm chloride impurities at 650° ° C. and 700° C., respectively. The 700° C. film leakage current is below $1.0e^{-9}$ A/cm$^2$ at 2 MW/cm, below $1.0e^{-9}$ A/cm$^2$ at 4 MV/cm, below $1.0e^{-8}$ A/cm$^2$ at 6 MV/cm.

Working Example 1: Atomic Layer Deposition of Silicon Oxide Films with Dimethylaminotrimethylsilane with 2 ppm Chloride Impurities Silicon oxide films were deposited with dimethylaminotrimethylsilane with 2 ppm chloride impurities at 650° C. and 700° C., respectively. FIG. 2 depicts the leakage current curve, demonstrating higher breakdown voltage and low leakage current, especially for the silicon oxide film deposited at 700° C. The 700° C. film leakage current is below $1.0e^{-9}$ A/cm$^2$ at 2 MW/cm, below $1.0e^{-9}$ A/cm$^2$ at 4 MV/cm, below $1.0e^{-8}$ A/cm$^2$ at 6 MV/cm.

Although illustrated and described above with reference to certain specific embodiments and examples, the present invention is nevertheless not intended to be limited to the details shown. Rather, various modifications may be made in the details within the scope and range of equivalents of the claims and without departing from the spirit of the invention. It is expressly intended, for example, that all ranges broadly recited in this document include within their scope all narrower ranges which fall within the broader ranges.

The invention claimed is:
1. A process for depositing a silicon oxide film onto a substrate comprising the steps of:
a. providing a substrate in a reactor;
b. introducing into the reactor at least one silicon precursor wherein the at least one silicon precursor has a structure represented by Formula I:

$$R^1R^2{}_mSi(NR^3R^4)_n \qquad (I),$$

wherein $R^1$, $R^2$, and $R^3$ are each independently selected from a linear or branched $C_1$ to $C_{10}$ alkyl group, and a $C_6$ to $C_{10}$ aryl group;

$R^4$ is selected from hydrogen, a linear or branched $C_1$ to $C_{10}$ alkyl group, and a Ce to $C_{10}$ aryl group, and a $C_3$ to $C_{10}$ alkylsilyl group;

m is 0 to 2; and n is 1 to 3, wherein m+n=3;

and wherein the silicon precursor includes 5 ppm or less of chloride ions as measured by IC and is substantially free of one or more impurities selected from the group consisting of other halides, metals, and combinations thereof;

c. purging the reactor with purge gas;

d. introducing an oxygen source into the reactor; and e. purging the reactor with purge gas, wherein steps b through e are repeated until a desired thickness of silicon oxide is deposited, and wherein the process in conducted at one or more temperatures ranging from 700 to 720° C. and one or more pressures ranging from 50 miliTorr (mT) to 760 Torr.

2. The process of claim 1 wherein $R^3$ and $R^4$ are linked to form a cyclic ring structure.

3. The process of claim 1, wherein the at least one silicon precursor is selected from the group consisting of diethylaminotriethylsilane, dimethylaminotriethylsilane, ethylmethylaminotriethylsilane, t-butylaminotriethylsilane, iso-propylaminotriethylsilane, di-isopropylaminotriethylsilane, pyrrolidonotriethylsilane, diethylaminotrimethylsilane, dimethylaminotrimethylsilane, ethylmethylaminotrimethylsilane, t-butylaminotrimethylsilane, iso-propylaminotrimethylsilane, di-isopropylaminotrimethylsilane, pyrrolidonotrimethylsilane, diethylaminodimethylsilane, dimethylaminodimethylsilane, ethylmethylaminodimethylsilane, t-butylaminodimethylsilane, iso-propylaminodimethylsilane, di-isopropylaminodimethylsilane, pyrrolidinodimethylsilane, diethylaminodiethylsilane, dimethylaminodiethylsilane, ethylmethylaminodiethylsilane, t-butylaminodiethylsilane, iso-propylaminodiethylsilane, di-isopropylaminodiethylsilane, pyrrolidonodiethylsilane, bis(diethylamino) dimethylsilane, bis(dimethylamino)dimethylsilane, bis(dimethylamino)methylsilane, bis(ethylmethylamino)dimethylsilane, bis(di-isopropyllamino)dimethylsilane, bis(iso-propylamino)dimethylsilane, bis(tert-butylamino)dimethylsilane, bis(dimethylamino)methylsilane, bis(ethylmethylamino)dimethylsilane dipyrrolidinodimethylsilane, bis(diethylamino)diethylsilane, bis(dimethylamino)diethylsilane, bis(ethylmethylamino)diethylsilane, bis(di-isopropylamino)diethylsilane, bis(iso-propylamino)diethylsilane, bis(tert-butylamino)diethylsilane, dipyrrolidinodiethylsilane, bis(diethylamino)methylvinylsilane, bis(dimethylamino)methylvinylsilane bis(ethylmethylamino)methylvinylsilane, bis(di-isopropyllamino)methylvinylsilane, bis(iso-propylamino)methylvinylsilane, bis(tert-butylamino)methylvinylsilane, dipyrrolidino methylvinylsilane, 2,6-dimethylpiperidinomethylsilane, 2,6-dimethylpiperidinodimethylsilane, 2,6-dimethylpiperidinotrimethylsilane, tris(dimethylamino)phenylsilane, tris(dimethylamino)methylsilane, tris(dimethylamino)ethylsilane, methylaminotrimethylsilane, n-propylaminotrimethylsilane, iso-butylaminotrimethylsilane, n-butylaminotrimethylsilane, cyclohexaminotrimethylsilane, 2-methylpyrrolidinotrimethylsilane, 2,5-dimethylpyrrolidinotrimethylsilane, piperidinotrimethylsilane, 1-methylpiperazinotrimethylsilane, pyrrolyltrimethylsilane, 2,5-dimethylpyrrolyltrimethylsilane, imidazolyltrimethylsilane, methoxytrimethylsilane, ethoxytrimethylsilane, and mixtures thereof.

4. The process of claim 1, wherein the purge gas is selected from the group consisting of nitrogen, helium and argon.

5. The process of claim 1, wherein the oxygen source is selected from the group consisting of oxygen, peroxide, oxygen plasma, oxygen/hydrogen, oxygen/water, water vapor, water vapor plasma, hydrogen peroxide, ozone source, and combination thereof.

6. The process of claim 1, further comprising the following steps f and g after step e:

f. introducing water vapor or a hydroxyl source into the reactor; and g. purging the reactor with purge gas.

7. A process for depositing a silicon oxide film comprising the steps of:

a. providing a substrate in a reactor;

b. introducing into the reactor at least one silicon precursor wherein the at least one silicon precursor has a structure represented by Formula I:

$$R^1R^2{}_mSi(NR^3R^4)_n \qquad (I),$$

wherein $R^1$, $R^2$, and $R^3$ are each independently selected from a linear or branched $C_1$ to Co alkyl group, and a $C_6$ to $C_{10}$ aryl group;

$R^4$ is selected from hydrogen, a linear or branched $C_1$ to $C_{10}$ alkyl group, and a $C_6$ to $C_{10}$ aryl group, and a $C_3$ to $C_{10}$ alkylsilyl group;

m is 0 to 2; and n is 1 to 3, wherein m+n=3;

wherein the silicon precursor includes 50 5 ppm or less of chloride ions as measured by IC and is substantially free of one or more impurities selected from the group consisting of halides, metals, and combinations thereof;

c. purging the reactor with purge gas;

d. introducing an oxygen source into the reactor;

e. purging the reactor with purge gas;

f. introducing water vapor or OH source into the reactor; and g. purging the reactor with purge gas, wherein steps b through g are repeated until desired thickness is deposited, and wherein process temperature ranges from 700 to 720° C. and pressure in the reactor ranges from 50 miliTorr (mT) to 760 Torr.

8. The process of claim 7 wherein $R^3$ and $R^4$ are linked to form a cyclic ring structure.

9. The process of claim 7, wherein the at least one silicon precursor is selected from the group consisting of diethylaminotriethylsilane, dimethylaminotriethylsilane, ethylmethylaminotriethylsilane, t-butylaminotriethylsilane, iso-propylaminotriethylsilane, di-isopropylaminotriethylsilane, pyrrolidonotriethylsilane, diethylaminotrimethylsilane, dimethylaminotrimethylsilane, ethylmethylaminotrimethylsilane, t-butylaminotrimethylsilane, iso-propylaminotrimethylsilane, di-isopropylaminotrimethylsilane, pyrrolidonotrimethylsilane, diethylaminodimethylsilane, dimethylaminodimethylsilane, ethylmethylaminodimethylsilane, t-butylaminodimethylsilane, iso-propylaminodimethylsilane, di-isopropylaminodimethylsilane, pyrrolidinodimethylsilane, diethylaminodiethylsilane, dimethylaminodiethylsilane, ethylmethylaminodiethylsilane, t-butylaminodiethylsilane, iso-propylaminodiethylsilane, di-isopropylaminodiethylsilane, pyrrolidonodiethylsilane, bis(diethylamino)dimethylsilane, bis(dimethylamino)dimethylsilane, bis(dimethylamino)methylsilane, bis(ethylmethylamino)dimethylsilane, bis(di-isopropyllamino)dimethylsilane, bis(iso-propylamino)dimethylsilane, bis(tert-butylamino)dimethylsilane, bis(dimethylamino)methylsilane, bis(ethylmethylamino)dimethylsilane dipyrrolidinodimethylsilane, bis(diethylamino)diethylsilane, bis(dimethylamino)diethylsilane, bis(ethylmethylamino)diethylsilane, bis(di-isopropylamino)diethylsilane, bis(iso-propylamino)diethylsilane, bis(tert-butylamino)diethylsilane, dipyrrolidinodiethylsilane, bis(diethylamino)methylvinylsilane, bis(dimethylamino)methylvinylsilane bis(ethylmethylamino)methylvinylsilane, bis(di-isopropylamino)methylvinylsilane, bis(iso-propylamino)methylvinylsilane, bis(tert-butylamino)methylvinylsilane, dipyrrolidino methylvinylsilane, 2,6-dimethylpiperidinomethylsilane, 2,6-dimethylpiperidinodimethylsilane, 2,6-dimethylpiperidinotrimethylsilane, tris(dimethylamino)phenylsilane, tris(dimethylamino)methylsilane, tris(dimethylamino)ethylsilane, methylaminotrimethylsilane, n-propylaminotrimethylsilane, iso-butylaminotrimethylsilane, n-butylaminotrimethylsilane, cyclohexaminotrimethylsilane, 2-methylpyrrolidinotrimethylsilane, 2,5-dimethylpyrrolidinotrimethylsilane, piperidinotrimethylsilane, 1-methylpiperazinotrimethylsilane, pyrrolyltrimethylsilane, 2,5-dimethylpyrrolyltrimethylsilane, imidazolyltrimethylsilane, methoxytrimethylsilane, ethoxytrimethylsilane, and mixtures thereof.

10. The process of claim 7, wherein the purge gas is selected from the group consisting of nitrogen, helium, and argon.

11. The process of claim 7, wherein the oxygen source is selected from the group consisting of oxygen, peroxide, oxygen plasma, water vapor, water vapor plasma, hydrogen peroxide, and ozone source.

\* \* \* \* \*